United States Patent [19]
Devore et al.

[11] Patent Number: 5,408,141
[45] Date of Patent: Apr. 18, 1995

[54] SENSED CURRENT DRIVING DEVICE

[75] Inventors: Joseph A. Devore; Ross E. Teggatz, both of Dallas, Tex.; Konrad Wagensohner, Mauern, Germany

[73] Assignee: Texas Instruments Incorporated, Dallas, Tex.

[21] Appl. No.: 160

[22] Filed: Jan. 4, 1993

[51] Int. Cl.[6] .......................................... H03K 3/353
[52] U.S. Cl. ..................... 327/541; 327/362; 327/545; 327/577; 327/581; 327/108; 257/341
[58] Field of Search ............... 307/296.1, 296.4, 296.6, 307/296.5, 296.8, 310, 491, 494, 501, 299.2; 257/341, 365, 401, 461; 437/51, 56

[56] References Cited

U.S. PATENT DOCUMENTS

| | | | |
|---|---|---|---|
| 3,643,149 | 2/1972 | Nienhuis | 257/365 |
| 4,571,606 | 2/1986 | Benjamin et al. | 257/341 |
| 4,636,825 | 1/1987 | Baynes | 257/401 |
| 4,751,405 | 6/1988 | Bufano, Jr. et al. | 307/491 |
| 4,763,021 | 8/1988 | Stickel | 257/310 |
| 4,893,158 | 1/1990 | Mihara et al. | 257/341 |
| 5,023,692 | 6/1991 | Wodarczyk et al. | 257/341 |
| 5,034,796 | 7/1991 | Zommer | 257/341 |
| 5,063,307 | 11/1991 | Zommer | 257/467 |
| 5,079,456 | 1/1992 | Kotowski et al. | 307/491 |
| 5,227,676 | 7/1993 | Bahr et al. | 307/491 |
| 5,231,315 | 7/1993 | Thelen, Jr. | 307/491 |

*Primary Examiner*—Terry D. Cunningham
*Attorney, Agent, or Firm*—Robby T. Holland; Wade James Brady, II; Richard L. Donaldson

[57] ABSTRACT

An integrated power device comprises a power transistor (26) and a plurality of sense transistors (38), (40), (42), (44), and (46). Sense transistors (38), (40), (42), and (44) are constructed around the periphery of the active area occupied by power transistor (26). Sense transistor (46) is located within the interior of the active area occupied by power transistor (26) and contact is made to the necessary source region (64) of transistor (46) using a second level of metal interconnect to form a source contact (74).

4 Claims, 4 Drawing Sheets

SENSED CURRENT DRIVING DEVICE

TECHNICAL FIELD OF THE INVENTION

This invention relates in general to the field of semiconductor devices and more particularly to an improved sensed current driving device and method for forming the same.

BACKGROUND OF THE INVENTION

Large integrated circuit power devices are commonly used to provide large amounts of current to drive external loads. These devices can provide on the order of one-half amp to ten amps or higher and are commonly formed using large lateral or vertical MOS structures. A chief concern in circuits used to drive external loads is monitoring the current provided by the integrated power device. Conventional methods of sensing this current place a small resistor in series with the power device and measure the voltage drop across the resistor to determine the current output by the power device. This approach suffers from the problem that the resistor dissipates a great deal of power due to the high current levels passing through it and voltage drops across this resistor reduces gate drive resulting in an increase in the output resistance of the power transistor.

A more sophisticated approach to monitoring the output current involves the use of a sense device constructed and connected in parallel with the power device. The sense device is commonly a second MOS device which is constructed using the same processes as the power device but which is many hundreds times smaller than the power device. The sense device drives a current that is proportional to the current passing through the power device. As such, the sense device can be used to track and control the amount of current output by the power device. In order to accurately track the amount of current output by the power device, the sense device must be constructed proximate the power device. The power device commonly occupies a great deal of the surface of the semiconductor substrate. If the sense devices are put on the periphery of the area occupied by the power device, the sense device may not accurately track the operation of the power device due to thermal gradients present within the integrated device.

Accordingly, a need has arisen for a method of constructing an integrated device comprising a sense and a power device that reduces or eliminates disadvantages associated with prior configurations.

SUMMARY OF THE INVENTION

In accordance with the teachings of the present invention, a power device and sense device configuration is provided that substantially reduces disadvantages associated with prior configurations.

According to one embodiment of the present invention, an integrated power circuit is provided that comprises a power transistor that occupies a first portion of active area of the surface of a semiconductor substrate. A sense transistor is disposed such that it is substantially surrounded by the first portion of active area. A conductive interconnect is disposed outwardly from the first active area and is coupled to the sense transistor such that signals from the interior of the power transistor are communicated to other portions of the circuit outside of the first active area.

An important technical advantage of the configuration of the present invention inheres in the placement of sense devices in the center of the power device as well as around the periphery. This eliminates the effects of thermal gradients over the operation of the integrated device. As such, the sense device can accurately track the current output by the entire power device.

An additional technical advantage of the present invention inheres in the fact that the use of multiple levels of conductive interconnects allows for the placement of sense devices in the interior of large power devices without sacrificing critical substrate surface area for the routing of signals to the sense device.

BRIEF DESCRIPTION OF THE DRAWINGS

A more complete understanding of the present invention may be acquired by referring to the accompanying drawings in which like reference numbers indicate like features and wherein.

DETAILED DESCRIPTION OF THE INVENTION

Figure 1:
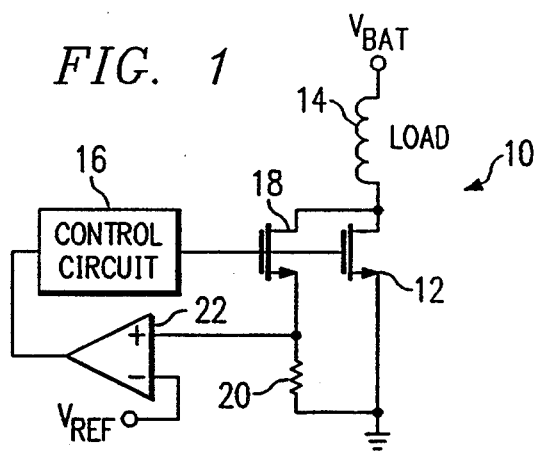
FIG. 1 is a schematic diagram of a power device and sense device coupled in a low side circuit configuration.

FIG. 1 is a schematic diagram of the circuit indicated generally at 10 that shows a low side configuration of an integrated current driving circuit. Circuit 10 comprises a power transistor 12. Transistor 12 may comprise, for example, a large vertical or lateral MOS field effect transistor. Transistor 12 has its source coupled to ground potential and its drain coupled to a supply voltage, $V_{bat}$, through a load 14. Load 14 may comprise in particular applications a coil of a motor, a solenoid, or a lamp. Transistor 12 has its gate coupled to a control circuit 16. The gate of transistor 12 is also coupled to the gate of a sense transistor 18. The drain of sense transistor 18 is coupled to the drain of power transistor 12. The source of sense transistor 18 is coupled to ground potential through a resistor 20. The source of sense transistor 18 is coupled to one input of a comparator 22. The second input of comparator 22 is coupled to a reference voltage $V_{ref}$. The output of comparator 22 provides the control signal for the control circuit 16.

Sense transistor 18 may comprise a proportionately smaller lateral or vertical MOS field effect transistor which is constructed in an integrated semiconductor substrate proximate power transistor 12. During the operation of circuit 10, the current passing through resistor 20 provided by sense transistor 18 is proportionate to the current being provided to the load by the power transistor 18 due to the fact that the gates of power transistor 12 and sense transistor 18 are receiving the same signal from control circuit 16. The amount of current provided by sense transistor 18 is determined by comparing the voltage at the source of transistor 18 created by resistor 20 using the comparator 22. Resistor 20 is relatively small, for example, on the order of a few hundred ohms, to prevent the voltage drop across resistor 20 from creating a disparity in the operation of transistors 18 and 12. Control circuit 16 receives the signal from comparator indicative of the amount of current being provided by the power transistor 12 to the load 14. The control circuit 16 may comprise any number of conventional signal processing circuits which can function to shut off the gate drive to the transistors 18 and 12 or provide any other necessary control signals to transistors 18 and 12 to provide for the appropriate wave form for the current provided by transistor 12. In addition, many implementations will use a number of sense transistors as will be discussed herein. The signals from these sense transistors may be effectively averaged using conventional techniques to provide for an average value of the current passing through all the sense transistors.

In order for circuit 10 to operate properly, transistor 18 must track as closely as possible the performance and operating characteristics of transistor 12. As such, it is important that transistor 18 and transistor 12 be formed using the same processes and be placed as closely as possible together on an integrated semiconductor substrate. Any influence which affects the operation of transistor 18 without affecting the operation of transistor 12 can create a disparity between the transistors and can have a detrimental effect on the overall operation of circuit 10 including, especially, a lack of predictability in the amount of current output by transistor 12. One such problem involves the layout of the integrated device comprising both transistors 12 and 18. If transistor 18 is placed on the periphery of the surface occupied by transistor 12, thermal gradients can affect transistor 18 to a greater degree than they affect the overall function of transistor 12. These thermal gradients can create a disparity in the operation of transistor 18 with respect to the operation of transistor 12 and can create inaccuracies in the control of transistor 12 using the sense transistor 18, the comparator 22 and the control circuitry 16. The teachings of the present invention alleviate this possible disparity by allowing for efficient layouts of transistors 12 and 18 which eliminate this problem by utilizing multi-level conductive interconnect as a means for optimally integrating transistors 12 and 18 in a defined semiconductor area. These layouts will be more fully described with reference to FIGS. 3, 4 and 5 herein.

Figure 2:
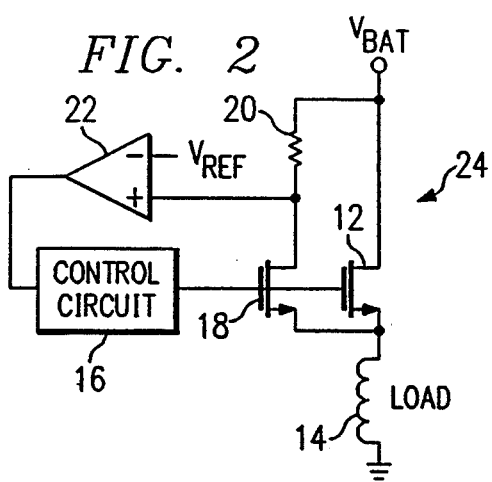
FIG. 2 is a schematic diagram of a power device and sense device coupled in a high side circuit configuration.

FIG. 2 is a schematic diagram which illustrates a circuit 24 which comprises a high side configuration of the components described with reference to FIG. 1 and circuit 10 previously. In circuit 24, power transistor 12 has its source coupled to the source of sense transistor 18. The sources of both transistors 12 and 18 are coupled to ground through the load 14. The drain of transistor 12 is coupled to the supply voltage, $V_{bat}$. The drain of transistor 18 is coupled to the supply voltage $V_{bat}$ through the resistor 20. The voltage across resistor 20 is once again measured by the comparator 22 which supplies a control signal to the control circuitry 16. Control circuitry 16 then provides the appropriately timed and shaped gate voltage for both transistors 18 and 12. The same concerns with respect to the operation of transistors 12 and 18 are relevant to the operation of circuit 24 as was described previously with reference to circuit 10. The current provided to the load 14 by the power transistor 12 can only be tracked by the sense transistor 18 if the transistors 12 and 18 are constructed using the same processes or placed proximate one another and are subjected to the same external influences.

Figure 3:
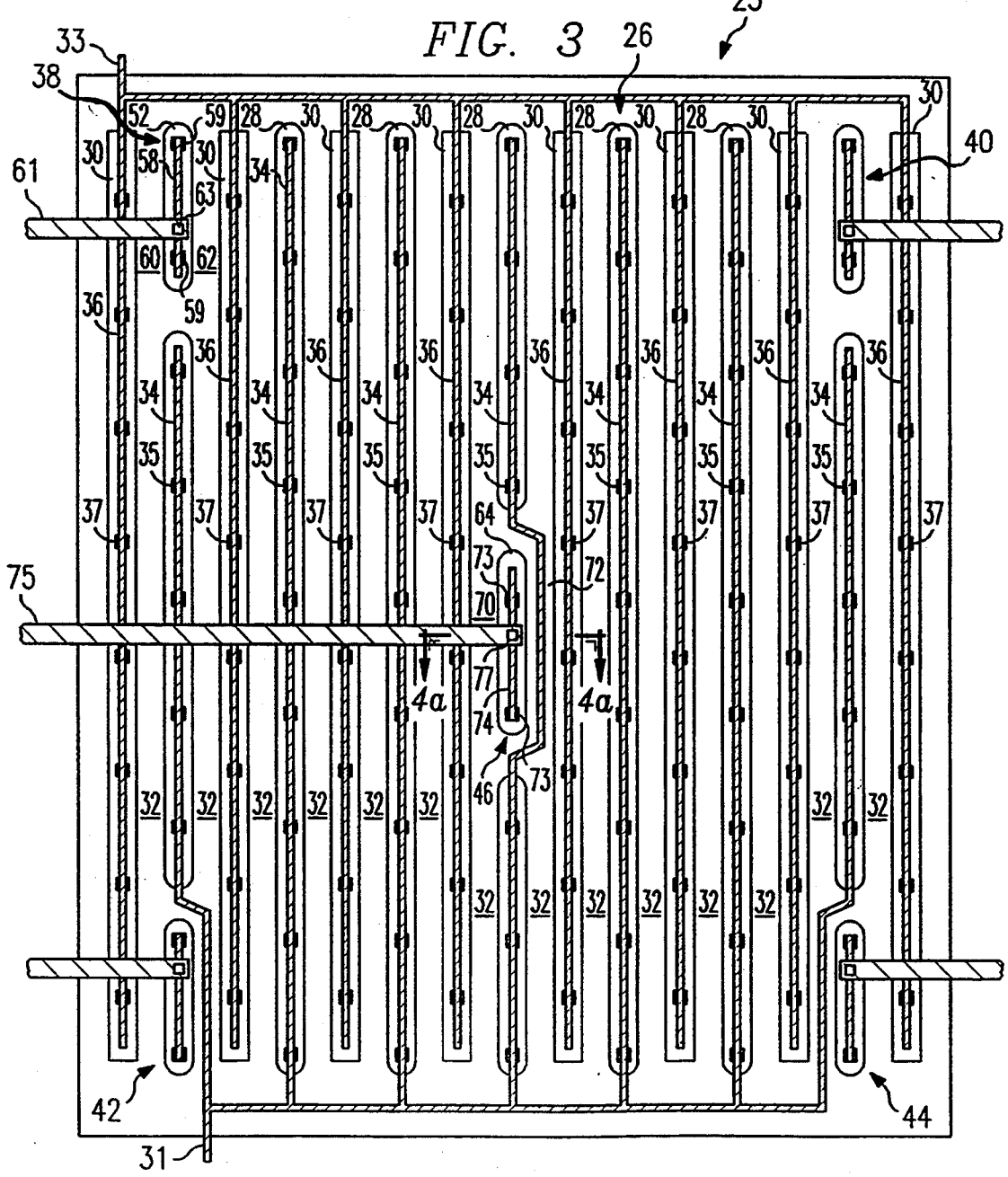
FIG. 3 is a plan view of a layout of a power device and sense device low side configuration constructed according to the teachings of the present invention.

FIG. 3 illustrates a plan view of a portion of an integrated circuit indicated generally at 25. The majority of the surface shown in FIG. 3 is covered by a power transistor 26 comprising a plurality of source regions 28 and a plurality of drain regions 30. FIG. 3 illustrates an exemplary lateral MOS configuration for transistor 26 for purposes of teaching the advantages of the present invention. It should be understood that the present invention is equally applicable to other power devices such as vertical MOS configurations. As shown in FIG. 3, source regions 28 and drain regions 30 alternate so as to define channel regions indicated at 32 in FIG. 3. Gate conductors which are not shown for purposes of clarity are disposed outwardly from channel regions 32 and insulated from channel regions 32 by gate insulator layers. These gate conductors are operable to electrically actuate the channel regions 32 in order that current may selectively flow between the source and drain regions 28 and 30, respectively. Contact is made to source region 28 by source conductors 34. Source conductors 34 are joined to form source lead 31. Contact is made to drain region 30 by drain conductors 36. Drain conductors 36 are joined to form drain lead 33. Source and drain conductors 36 may comprise metal and are formed using a layer of metal that is photolithographically patterned to form the interconnections shown in FIG. 3. Although source and drain conductors 34 and 36 are shown to be narrower than respective source and drain regions 28 and 30, in actuality conductors 34 and 36 are larger than the regions which they contact to allow for the maximum amount of metal to handle the large amounts of current handled by the device 25. Electrical contact is made between source regions 28 and source conductors 34 by the periodic placement of source contacts 35 as shown in FIG. 3. Similarly, drain contacts 37 provide the electrical connection between drain regions 30 and drain conductors 37.

FIG. 3 also illustrates five sense transistors indicated generally at 38, 40, 42, 44 and 46. Sense transistor 38 comprises an independent source region 52 and the proximate portions of drain regions 30. Contact is made to source region 52 by source conductor 58. Source conductor 58 comprises a portion of the conductive layer used to form source and drain conductors 34 and 36. Electrical contact is made between source region 52 and source conductor 58 using source contacts 59. The signals from sense transistor 38 are routed outside of the active area occupied by transistor 26 using a source lead 61 which contacts source conductor 58 through a source via 63. Source lead 61 is disposed outwardly from and insulated from an active area comprising transistor 26 and the layer of metal forming source and drain conductors 34 and 36. Source lead 61 is formed from a second layer of conductive material such as metal. Transistor 38 comprises channel regions 60 and 62 disposed between proximate portions of drain regions 30 and source region 52. A gate conductor which is not shown for purposes of clarity is disposed outwardly from and insulated from channel region 60 and 62 and is operable to electrically actuate and control the conductance of electricity in channel regions 60 and 62. Transistors 40, 42, and 44 are identical in construction to transistor 38. Transistors 38, 40, 42, and 44 are proportionate in size to transistor 26 and are constructed using the same processes that are used to construct the components of transistor 26. As such, transistors 38, 40, 42, and 44 can be used to track and control the amount of current provided by transistor 26 so long as the gate controlling transistor 26 and the gates controlling transistors 38, 40, 42, and 44 are connected. In addition, due to the fact that transistors 38, 40, 42, and 44 are located on the periphery of the active semiconductor area occupied by transistor 26, contacts can be made to the components of the transistors 38, 40, 42, and 44 without interfering with the placement or device density of transistor 26.

However, significant error can be introduced in the operation of the circuit combining transistors 26, 38, 40, 42, and 44 due to thermal gradients across an integrated system if only transistors 38, 40, 42, and 44 are used to track and control the current provided by transistor 26. For example, thermal effects from a portion of an integrated circuit proximate transistor 38 might affect the operation of transistor 38 without effecting the overall operation of transistor 26. Accordingly, the control of transistor 26 provided in part by the operation of transistor 38 could be in error.

The error introduced by thermal gradients and other considerations can be eliminated by the placement of sense transistors around the periphery of the power transistor and by placing additional sense transistors in the interior of the power transistor. Accordingly, sense transistor 46 is placed in the interior of the active area occupied by transistor 26. Sense transistor 46 comprises an independent source region 64 and proximate portions of drain regions 30. Source region 64 and proximate portions of drain regions 30 define channel regions 70 and 72 placed between them. Transistor 46 comprises a gate conductor insulatively disposed outwardly from channel regions 70 and 72. The gate conductor controls the operation of transistor 46 and is coupled to the gate associated with transistor 26 and transistors 38 through 44. As was discussed previously with reference to FIG. 1, the source of the sense transistor is not coupled to the surrounding systems but is routed to a comparator and a resistor in order to provide control signals for the overall circuit. As such, source 64 is connected to a source conductor 74 by source contacts 73. Source conductor 74 is coupled to a source lead 75 by a source via 77. Source lead 75 is disposed outwardly from and is insulated from the active area of the substrate occupied by transistor 26 and the layer of metal forming source and drain conductors 34 and 36 and source conductor 74.

The interconnection of the gates used to actuate transistors 26 and 38 through 46 may be accomplished using a layer of conductive polycrystalline silicon. The source and drain conductors 34 and 36 and, for example, source conductors 58 and 74 comprise a portion of a first layer of conductive material such as metal. A second layer of metal is then used to form source leads 61 and 75. The use of this second layer of conductive material allows for the placement of transistor 46 within the interior of the active area occupied by transistor 26. The active area of transistor 26 substantially surrounds transistor 46 thereby allowing the complete use of all semiconductor area without having to open pathways into the interior of the power device to provide for the placement of sense devices within that interior. Transistor 46 is affected by thermal gradients affecting the interior of transistor 26. As such, transistor 46 will more accurately track the operation of transistor 26. The source lead 75 provides communication of the signal necessary to provide control over the entire circuit from the interior of the active area occupied by transistor 26 to other portions of the circuit outside this active area. The signal carried by source lead 75 can be averaged with similar signals such as the signal provided on source lead 61 to provide an average control signal for the entire circuit. The averaging of the source signals across the entire area occupied by the power device can effectively eliminate the effects of any thermal gradients or other error-inducing factors on the operation of the circuit as a whole.

For purposes of clarity, the remainder of the second conductive layer formed simultaneously with leads 61 and 75 is not shown. As discussed previously, the large amounts of current handled by transistor 26 create the need for as much metal as possible in contact with the active portions of transistor 26. As such, a sheet of metal is formed outwardly from virtually the entirety of transistor 26. This sheet is divided into a source half and a drain half and is formed around and separated from the leads to the sense transistors. The source half of the metal sheet is coupled by periodic placement of vias to the source conductors 34. Similarly, the drain half of the sheet is coupled by vias to the drain conductors 36. In this manner, the second layer of metal is not only used to advantageously route the signals from the sense transistors, but is also used to provide extra conductive material for the large amounts of current handled by the transistor 26.

It should be understood that the plan view shown in FIG. 3 is not to scale but is shown solely for the purpose of teaching the relative positioning of the power and sense devices in the layout of the present invention. In most implementations, the ratio of the active area of the power device to those occupied by the sense device is on the order of a thousand to one or higher. Further, the particular implementation may use many sense transistors to accurately track the operation of a single large power device. Due to the teachings of the present invention, these sense transistors can be placed throughout the active area, including both the periphery and the interior of the active area occupied by the power device to accurately track its operation. As discussed previously, this is due to the use of a first conductive layer to efficiently connect the power transistor device and a second conductive layer to route the signals from the interior sense transistors needed for the control of the device.

Figure 4A:
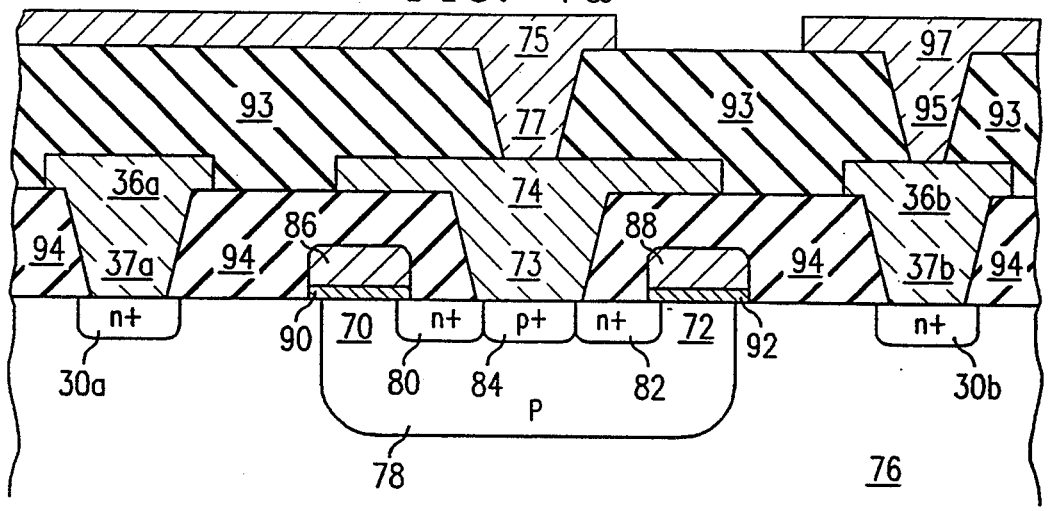
FIG. 4a is a cross-sectional diagram illustrating the connections made to a sense device of a low side configuration constructed according to the teachings of the present invention.

FIG. 4a is a cross-sectional illustration of a sense transistor such as sense transistor 46 which is constructed according to the teachings of the present invention. Sense transistor 46 is shown to comprise drain regions 30a and 30b which are constructed on the outer surface of an (n)-well 76. (N)-well 76 comprises a large diffused region of a semiconductor substrate. A (p)-well 78 is disposed between drain regions 30a and 30b. Source region 64 is shown in FIG. 4 to comprise two (n+) regions 80 and 82 and a (p+) region 84 disposed between (n+) regions 80 and 82. As discussed previously, channel regions 70 and 72 are actuated by gate conductors 86 and 88, respectively. Gate conductor 86 is separated and insulated from channel region 70 by gate insulator layer 90. Gate conductor 88 is separated from and insulated from channel region 72 by a gate insulator layer 92.

Contact is made between drain region 30a and a drain conductor 36a by a drain contact 37a. Similarly, contact is made between drain region 30b and a drain conductor 36b by a drain contact 37b. Source regions 80 and 82 and backgate region 84 are coupled to source conductor 74 by source contact 73. Drain conductors 36a and 36b and source conductor 74 are separated from surface of substrate 76 and gate conductors 86 and 88 by a first isolation insulator layer 94 which may comprise, for example, silicon dioxide. Source lead 75 is coupled to source conductor 74 by source via 77. A portion of the drain half 97 of the metal sheet discussed previously is shown in FIG. 4a coupled to drain conductor 36b by a drain via 95. Drain conductors 36a and 36b and source conductor 74 are formed using a first layer of metal. Source lead 75 and drain sheet 97 are formed from a second metal layer that is insulated from the first metal layer and the remainder of transistor 26 by a second isolation insulator layer 93.

Figure 4B:
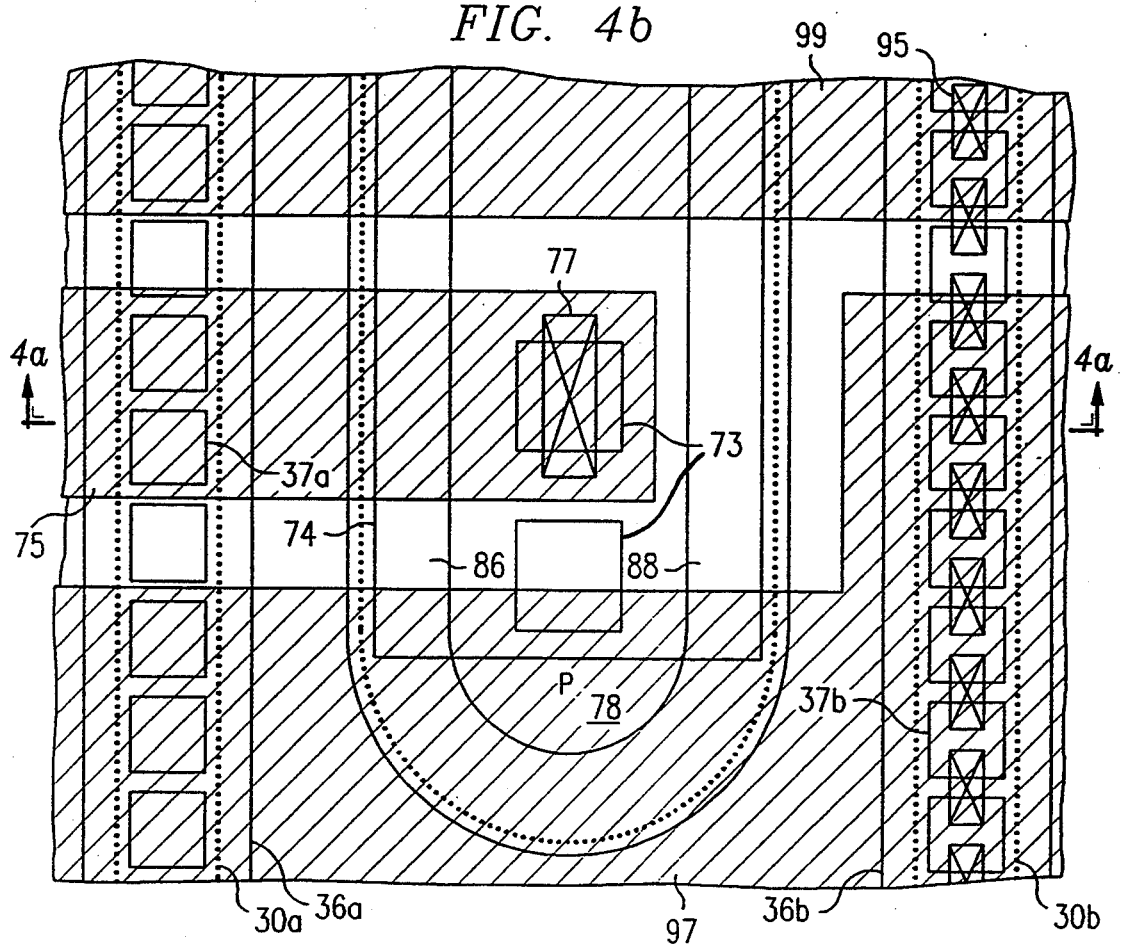
FIG. 4b is a plan view illustrating the connections made to a sense device of a low side configuration constructed according to the teachings of the present invention.

FIG. 4b is a plan view of transistor 46 described with reference to FIG. 3 showing the relative position of the structures described with reference to FIG. 4a. In addition, a portion of a source half 99 of the metal sheet described previously is also shown. As discussed previously, source sheet 99, drain sheet 97 and source lead 75 all comprise portions of the second level of metal.

The configurations described with reference to FIGS. 3, 4a and 4b provide for independent contact to the source of sense devices and as such are used in low side configurations such as circuit 10 described with reference to FIG. 1. The teachings of the present invention are equally applicable to high side configurations such as described with reference to circuit 24 in FIG. 2. In such configurations, independent contact must be provided to the drain of the sense devices. Such a configuration is shown in FIG. 5.

Figure 5:
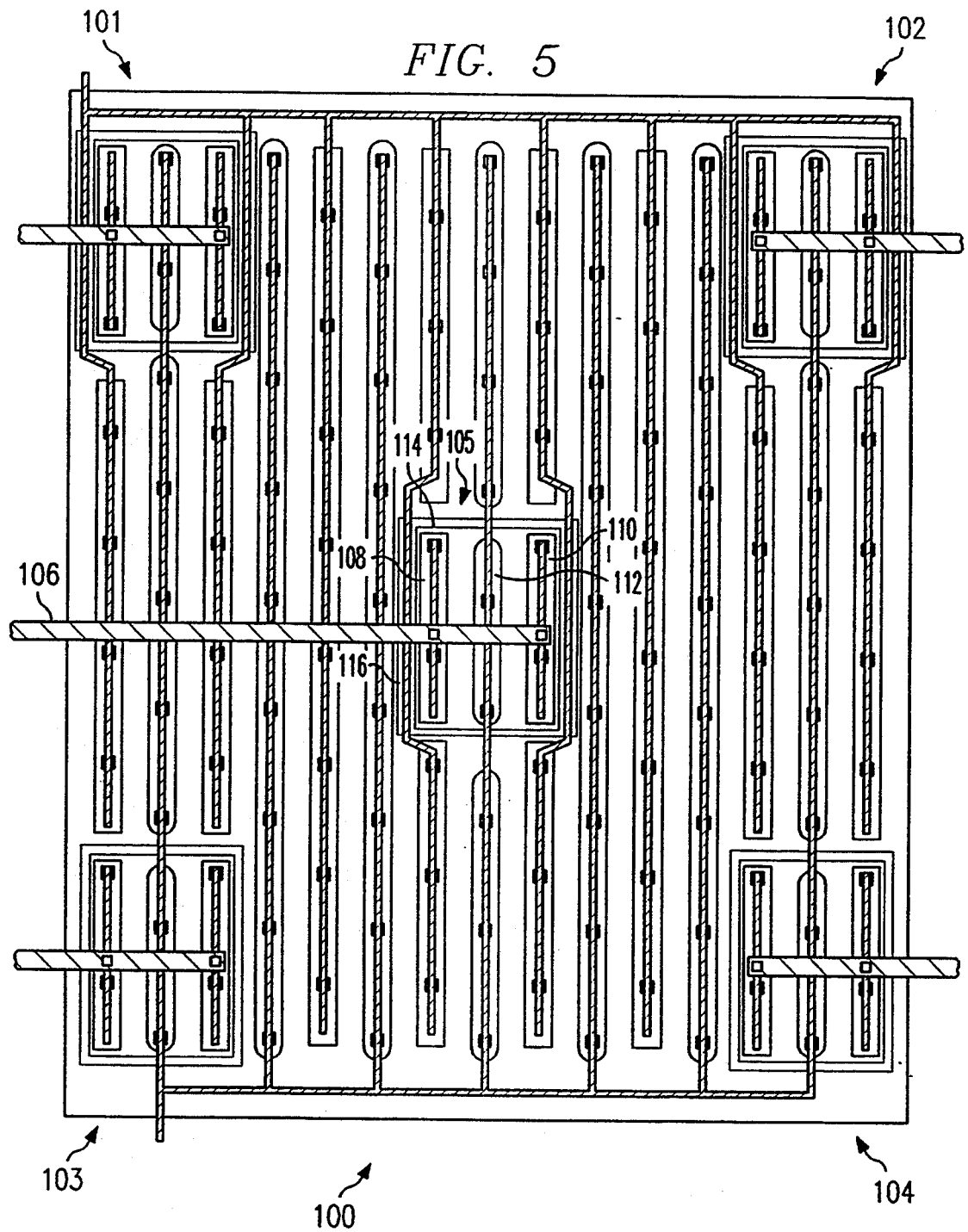
FIG. 5 is a plan view of a power device and sense device high side configuration constructed according to the teachings of the present invention.

FIG. 5 illustrates a plan view of a power transistor 100 and five sense transistors 101, 102, 103, 104 and 105. Power transistor 100 and sense transistors 101 through 105 are intended to be used in a high side configuration such as circuit 24 shown in FIG. 2. Power transistor 100 is essentially identical to transistor 26 described with reference to FIG. 3 previously. The only difference in the low side and high side configurations is that the high side configuration requires the formation of, for example, a drain lead 106 as shown in FIG. 5. Drain lead 106 is coupled to drain regions 108 and 110 of transistor 105. A source region 112 of transistor 105 is coupled to the source of transistor 100 as per the high side configuration discussed previously with reference to circuit 24 in FIG. 2. Drain lead 106 comprises a second level of conductive interconnect similar to source lead 75 described with reference to FIG. 3 previously.

In order for drain region 108 and 110 to be independent from the drain of transistor 100, an independent (n)-well 114 is formed. (N)-well 114 is separated from the (n)-well in which transistor 100 is formed by a (p)-well isolation region 116. Similar independent (n)-type wells and (p)-well isolation regions are provided for transistors 101, 102, 103, and 104. In operation the sense transistors 101 through 105 allow for the accurate tracking of the current provided by transistor 100 and the placement of sense transistor 105 within the interior of the active area occupied by transistor 100 eliminates the effects of thermal gradients and other considerations that may cause error in the operation of the overall circuit.

Figure 6:
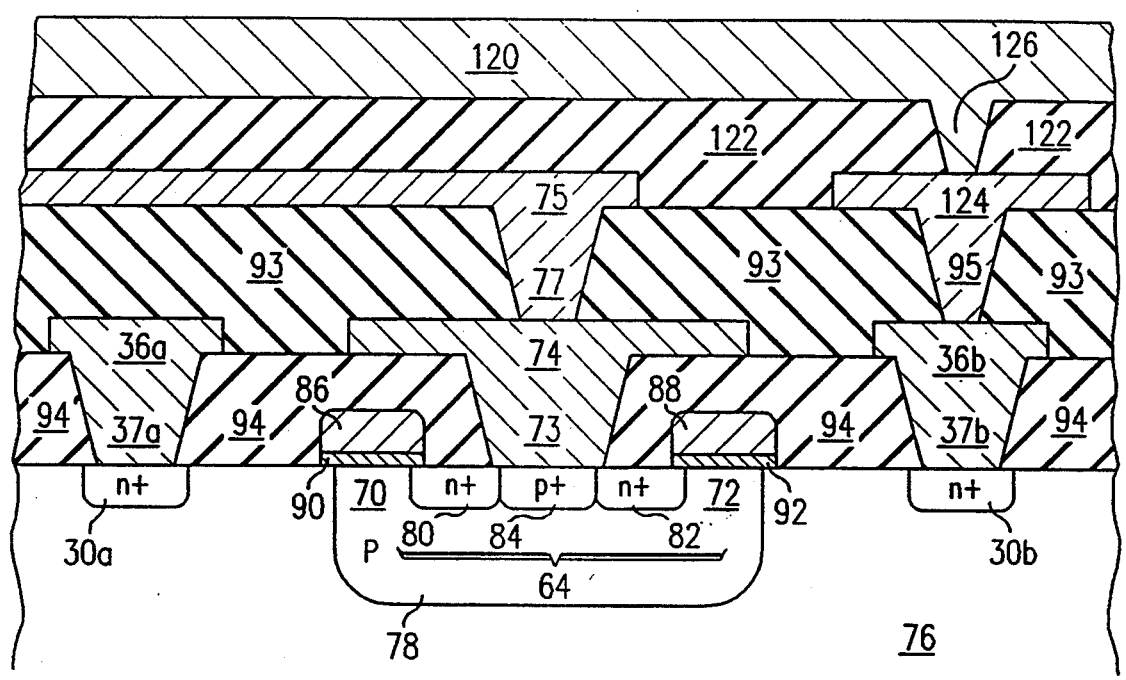
FIG. 6 is a cross-sectional diagram illustrating the connections made to a sense device using three separate conductive levels.

FIG. 6 is a cross-sectional illustration of an alternate embodiment of, for example, sense transistor 46 discussed with reference to FIGS. 3, 4a and 4b. FIG. 6 illustrates the use of a third level of conductive material such as, for example, metal. This third level of metal is indicated in FIG. 6 at 120 and is separated from source lead 75 by a third isolation insulator layer 122. According to the embodiment illustrated in FIG. 6, the drain sheet 97 in FIG. 4a is replaced by a second drain conductor 124 which is coupled to first drain conductor 36b through drain via 95 as discussed previously. Drain sheet 97 discussed with reference to FIGS. 4a and 4b is replaced by conductive layer 120. Conductive layer 120 is coupled to second drain conductor 124 by a second drain via 126 shown in FIG. 6. As shown in FIG. 6, conductive layer 120 may completely cover the surface disposed outwardly from source lead 75 and second drain conductor 124 and gaps need not be opened in conductive layer 120 for the routing of signals from sense devices around the peripheral within the interior of the power transistor. In this manner, a great deal of conductive material can be coupled to the diffused regions within the power transistor device aiding in the conductance of the large amounts of current passed through the device. The routing of signals from the sense devices is still accomplished on the second level of conductive material as discussed previously in accordance with the teachings of the present invention.

Although the present invention has been described in detail, it should be understood that various changes, substitutions and alterations may be made to the teachings described herein without departing from the spirit and scope of the present invention as solely defined by the appended claims.

What is claimed is:

1. An integrated power device, comprising:
   a sense transistor formed in a surface of a semiconductor wafer;
   a power transistor formed in the surface of the semiconductor wafer and surrounding the sense transistor;
   a conductive interconnect coupled to said sense transistor and disposed over the power transistor and;
   wherein said power transistor is disposed in a first well of a first conductivity type and said sense transistor is disposed in a second well of a second conductivity type.

2. The circuit of claim 1 wherein said conductive interconnect comprises a first layer of conductive material and further comprising a second layer of conductive material coupled to said power transistor and disposed outwards from and insulated from said conductive interconnect.

3. An integrated power circuit, comprising:
   a sense transistor formed in the surface of a semiconductor wafer;
   a power transistor formed in the surface of a semiconductor wafer;
   a conductive interconnect coupled to said sense transistor and disposed over the power transistor;
   a resistor having a first node coupled to said conductive interconnect, a second node of said resistor coupled to a first predetermined voltage level and said power transistor;

a comparator having first and second comparator inputs and a comparator output, said first comparator input coupled to said conductive interconnect, said second comparator input coupled to a second predetermined voltage level, said resistor causing a voltage sensed by said comparator and compared by said comparator to said second predetermined voltage level, said comparator generating a comparator output signal on said comparator output responsive to said comparison;

a control circuit having a control input and a control output, said control input coupled to said comparator output, said control circuit operable to receive said comparator output signal and generate a control signal on said control output, said control output coupled to gates of said power and sense transistors;

a load coupled to said power and sense transistors; and wherein said power transistor is disposed in a first well of a first conductivity type and said sense transistor is disposed in a second well of a second conductivity type.

4. The circuit of claim 3 wherein said conductive interconnect comprises a first layer of conductive material and further comprising a second layer of conductive material coupled to said power transistor and disposed outwards from and insulated from said conductive interconnect.

* * * * *